United States Patent [19]

Pham et al.

[11] Patent Number: 5,130,674

[45] Date of Patent: Jul. 14, 1992

[54] VOLTAGE CONTROLLED OSCILATOR HAVING CONTROLLED BIAS VOLTAGE, AGC AND OUTPUT AMPLIFIER

[75] Inventors: Phuc C. Pham; Gregory A. Davis, both of Chandler; Harold L. Spangler, Mesa, all of Ariz.

[73] Assignee: Motorola, Inc., Schaumburg, Ill.

[21] Appl. No.: 767,951

[22] Filed: Sep. 30, 1991

[51] Int. Cl.⁵ .......................... H03B 5/12; H03L 5/00
[52] U.S. Cl. ..................................... 331/109; 331/74; 331/117 R; 331/177 R; 331/183; 332/125; 332/135
[58] Field of Search ............. 331/109, 117 R, 117 FE, 331/167, 168, 177 R, 182, 183, 74, 75; 332/125, 135; 455/110, 113

[56] References Cited

U.S. PATENT DOCUMENTS

4,270,102  5/1981  Gawler et al. ............. 331/177 R X
5,027,429  6/1991  Kojima ......................... 332/127 X Primary Examiner—Siegfried H. Grimm
Attorney, Agent, or Firm—Bradley J. Botsch

[57] ABSTRACT

A voltage controlled oscillator circuit including an oscillator circuit having first and second terminals to which an external inductance is connected. A frequency control voltage ($V_F$) is applied through a bias circuit to the second terminal for varying the center frequency. The oscillator circuit may have an AGC circuit or a modulation circuit connected to it. An output amplifier is connected with the first terminal and has an adjustable output impedance for matching the input impedance of a load circuit.

15 Claims, 3 Drawing Sheets

VOLTAGE CONTROLLED OSCILATOR HAVING CONTROLLED BIAS VOLTAGE, AGC AND OUTPUT AMPLIFIER

BACKGROUND OF THE INVENTION

This invention relates to oscillators, for example, a voltage controlled oscillator circuit.

Voltage controlled oscillator (VCO) circuits are well known in the art and are utilized in a number of applications. A VCO circuit is typically responsive to a control signal that is varied to adjust the frequency of an output signal of the VCO circuit.

An oscillator circuit may be converted to a pseudo voltage controlled oscillator circuit wherein the oscillation frequency of the oscillator circuit is determined by an external inductor (L) and capacitor (C) tank circuit. Further, by utilizing an external varactor to function as the capacitor of the external LC tank circuit, the capacitance of the varactor can be varied by varying the voltage applied to the varactor. As a result, the resonant frequency of the external LC tank circuit is correspondingly varied thereby varying the oscillation frequency of the oscillator circuit. However, a varactor is very expensive. Further, the varactor increases the phase noise of the oscillation circuit.

Hence, there exists a need to provide an improved VCO circuit having voltage controlled tuning capability while minimizing the use of external components.

SUMMARY OF THE INVENTION

Briefly, there is provided a voltage controlled oscillator circuit having first, second and third terminals, an external inductor being coupled across the first and second terminals, a control voltage being applied to the third terminal, comprising an oscillator circuit being coupled to the first and second terminals for providing an output signal having a predetermined center frequency, the output signal of the oscillator circuit appearing at the first terminal; an output amplifier having an input and an output, the input of the output amplifier being coupled to receive the output signal of the oscillator circuit, the output of the output amplifier being coupled to an output terminal of the voltage controlled oscillator circuit, the output amplifier having an adjustable output impedance; and a bias circuit having an input responsive to the control voltage applied at the third terminal for providing an adjustable bias voltage to the second terminal such that when the control voltage is changed, the center frequency of the output signal of the oscillator circuit is changed.

The present invention will be better understood from the following detailed description taken in conjunction with the accompanying drawings.

DETAILED DESCRIPTION OF THE DRAWINGS

Figure 1:
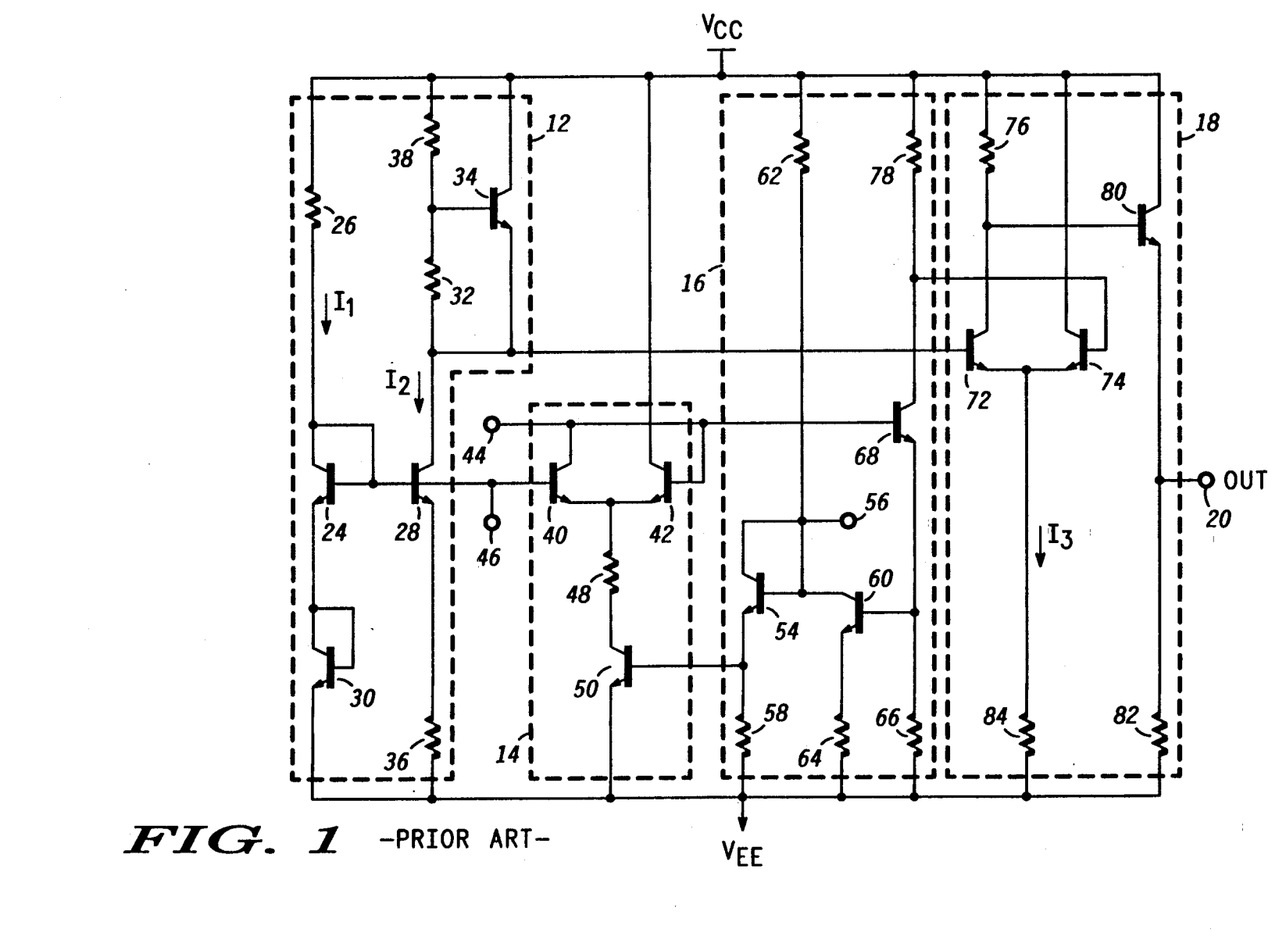
FIG. 1 is a detailed schematic diagram illustrating a prior art oscillator circuit.

Referring to FIG. 1, a detailed schematic diagram illustrating a prior art oscillator circuit is shown comprising bias circuit 12, oscillator circuit 14, automatic gain control (AGC) circuit 16 and output buffer 18. The output of the oscillator circuit is provided at terminal 20.

Bias circuit 12 includes transistor 24 having a collector coupled through resister 26 to a first supply voltage terminal at which the operating potential $V_{CC}$ is applied. The base of transistor 24 is coupled to the collector of transistor 24 and to the base of transistor 28. The emitter of transistor 24 is coupled to the base and collector of transistor 30 whereby the emitter of transistor 30 is coupled to a second supply voltage terminal at which the operating potential $V_{EE}$ is applied.

The collector of transistor 28 is coupled through resistor 32 to the base of transistor 34. The emitter of transistor 28 is coupled through transistor 36 to operating potential $V_{EE}$.

The base of transistor 34 is coupled through resistor 38 to operating potential $V_{CC}$. The collector of transistor 34 is coupled to operating potential $V_{CC}$, and the emitter of transistor 34 is coupled to the collector of transistor 28.

Oscillator circuit 14 includes transistor 40 having a collector coupled to the base of transistor 42 and to terminal 44. The base of transistor 40 is coupled to the base of transistor 28 and to terminal 46. The emitter of transistor 40 is coupled to the emitter of transistor 42. The collector of transistor 42 is coupled to operating potential $V_{CC}$.

The common emitters of transistors 40 and 42 are coupled through resistor 48 to the collector of transistor 50. The emitter of transistor 50 is coupled to operating potential $V_{EE}$.

AGC circuit 16 includes transistor 54 having a collector coupled to terminal 56 and an emitter coupled to the base of transistor 50. The emitter of transistor 54 is also coupled through resistor 58 to operating potential $V_{EE}$. The base of transistor 54 is coupled to the collector of transistor 54 and to the collector of transistor 60. Also, the base of transistor 54 is coupled through resistor 62 to operating potential $V_{CC}$.

The emitter of transistor 60 is coupled through resistor 64 to operating potential $V_{EE}$. The base of transistor 60 is coupled through resistor 66 to operating potential $V_{EE}$.

The base of transistor 60 is also coupled to the emitter of transistor 68, the latter having a base coupled to the collector of transistor 40. The collector of transistor 68 is coupled through resistor 78 to operating potential $V_{CC}$.

Output buffer 18 includes transistor 72 having a base coupled to the collector of transistor 28 and an emitter coupled to the emitter of transistor 74. The collector of transistor 72 is coupled through resistor 76 to operating potential $V_{CC}$, and the collector of transistor 74 is coupled to operating potential $V_{CC}$. The base of transistor 74 is coupled to the collector of transistor 68.

Transistor 80 has a collector coupled to operating potential $V_{CC}$, and a base coupled to the collector of transistor 72. The emitter of transistor 80 is coupled to terminal 20 and through resistor 82 to operating potential $V_{EE}$. Also, resistor 84 is coupled between the common emitters of transistors 72 and 74 and operating potential $V_{EE}$.

An external inductive load (L) is typically coupled across terminals 44 and 46. Likewise, an external capacitor (C) is also typically coupled between terminals 44 and 46. These external components form an external LC tank circuit that determines a center frequency ($F_C$) of oscillation for the oscillator circuit of FIG. 1 wherein $F_C = [2 \times pi \times (L \times C)^{-\frac{1}{2}}]$. The oscillation is achieved by coupling the base of transistor 42 to the collector of transistor 40 thereby constituting a positive feedback configuration. It is understood that oscillator circuit 14 is well known in the art.

It should be realized that an oscillatory signal appears at the collector of transistor 40 which is oscillating at a center frequency as determined by the external tank circuit.

The circuit FIG. 1 can also be utilized in voltage controlled mode by utilizing a varactor. In this mode, an external inductive load is typically coupled across terminals 44 and 46 as aforedescribed. In addition, an external varactor is coupled between terminal 44 and a terminal at which operating potential $V_{EE}$ is applied wherein an external voltage signal is utilized to vary the capacitance of the varactor thereby varying the center frequency of oscillation.

AGC circuit 16 functions to limit the current flowing through transistors 40 and 42 and to allow optimum frequency response for the oscillator circuit. For example, at higher frequencies the gain of the oscillator circuit rolls off (decreases) as is well known.

In particular, by incresing the voltage applied to terminal 56, the current flowing through transistor 54 increases thereby increasing the voltage appearing at the base of transistor 50 via resistor 58. This results in increasing the current through transistors 40 and 42 of oscillator circuit 14 thereby increasing the gain of oscillator circuit 14. Thus, at higher frequencies, the AGC circuit may become very useful.

Transistor 68 is utilized to translate the oscillatory signal appearing at the collector of transistor 40 to output buffer 18.

Output transistors 72 and 74, in conjunction with transistor 80, provide a buffered output at terminal 20. In particular, the oscillatory signal appearing at the collector of transistor 40 is amplified through transistor 68 and applied to the base of transistor 74. The base of transistor 72 is maintained at a constant bias voltage via bias circuit 12. It should be realized that the signal appearing at the collector of transistor 72 is an oscillatory signal that also oscillates at the center frequency of oscillation circuit 14. The voltage swing of the signal appearing at the collector of transistor 72 is determined by the value of resistor 76. Also, the total current ($I_3$) flowing through transistors 72 and 74 is determined by the value of resistor 84.

Transistor 80 further buffers the signal appearing at the collector of transistor 72 and provides the output signal of the circuit of FIG. 1 to terminal 20. The output signal provided at terminal 20 is an oscillatory signal that oscillates at a frequency substantially equal to the center frequency of oscillation circuit 14.

Bias circuit 12 includes transistors 28 and 34 which respectively provide bias voltages to the base of transistor 40 of the oscillator circuit 14 and to the base of transistor 72 of output stage 18.

In particular, bias circuit 12 includes a current mirror circuit comprised of transistors 24, 28 and 30, and resistor 36 such that current flowing through transistor 28 and resistor 36 ($I_2$) is substantially equal to a predetermined multiple of the current flowing through transistors 24 and 30 since resistor 36 may be chosen to provide gain. As a result, predetermined bias voltages are generated at the base of transistor 28 and the emitter of transistor 34. In particular, the voltage appearing at the base of transistor 28, $V_{B(28)}$, is expressed in EQN. 1.

$$V_{B(28)} = V_{CC} - (I_1 \times R_{26})  \qquad \text{EQN.1}$$

Moreover, the voltage appearing at the emitter of transistor 34 is expressed in EQN. 2.

$$V_{E(34)} = V_{CC} - [1 + R_{38}/R_{32}] \times V_{BE(34)} \qquad \text{EQN.2}$$

A major disadvantage of the oscillator circuit of FIG. 1 is that in order to vary the center frequency of oscillation of oscillation circuit 14, the value of the components in the external tank circuit must be varied. As aforementioned, one way to vary the external LC tank circuit is to utilize a varactor such that when an external voltage which is applied to a terminal of the varactor is varied, the equivalent capacitance of the varactor also varies thereby varying the equivalent capacitance of the LC tank circuit. However, a varactor is very expensive and also requires an extra external pin. Further, the varactor increases the phase noise of oscillation circuit 14.

Figure 2:
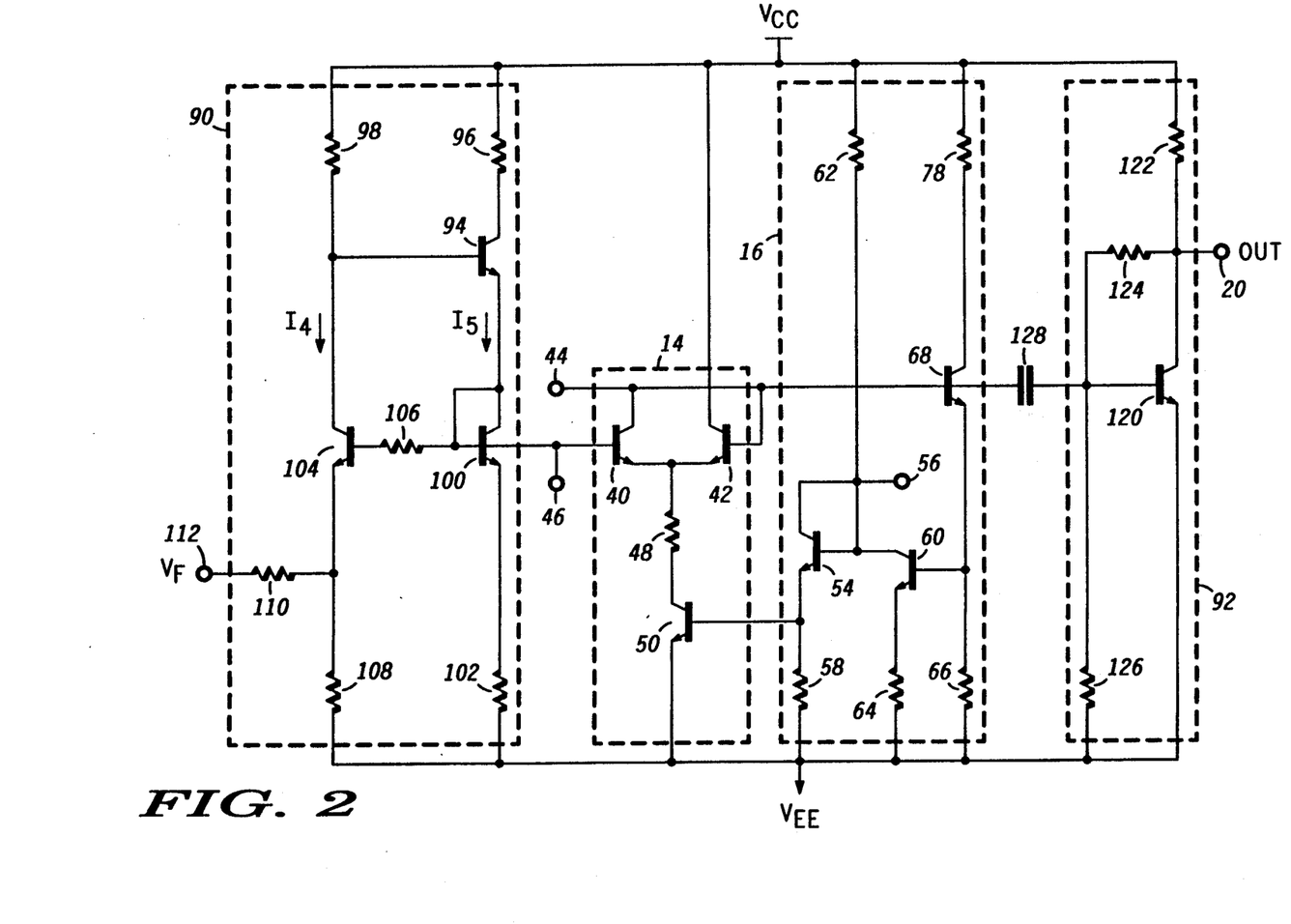
FIG. 2 is a detailed schematic diagram illustrating a voltage controlled oscillator circuit in accordance with the present invention.

Referring to FIG. 2, a detailed schematic diagram illustrating a voltage controlled oscillator circuit is shown. It is understood that components shown in FIG. 2 which are similar to components shown in FIG. 1 are identified by the same reference numbers. The voltage controlled oscillator (VCO) circuit of FIG. 2 utilizes oscillator circuit 14 and AGC circuit 16 as aforedescribed for FIG. 1. However, the VCO circuit of FIG. 2 utilizes bias circuit 90 and output amplifier 92 in place of bias circuit 12 and output buffer 18 of the circuit of FIG. 1.

Bias circuit 90 includes transistor 94 having a collector coupled through resistor 96 to operating potential $V_{CC}$. The base of transistor 94 is coupled through resistor 98 to operating potential $V_{CC}$. The emitter of transistor 94 is coupled to the base and collector of transistor 100 whereby the base of transistor 100 supplies an output bias voltage to the base of transistor 40 of oscillator circuit 14. Further, the emitter of transistor 100 is coupled through resistor 102 to operating potential $V_{EE}$.

Transistor 104 has a collector coupled to the base of transistor 94 and a base coupled through resistor 106 to the base of transistor 100. The emitter of transistor 104 is coupled through resistor 108 to operating potential $V_{EE}$. In addition, the emitter of transmitter 104 is coupled through resistor 110 to terminal 112 at which voltage potential $V_F$ is applied.

Output amplifier 92 includes transistor 120 having a collector coupled to terminal 20 and through resistor 122 to operating potential $V_{CC}$. The base of transistor 120 is coupled through feedback resistor 124 to the collector of transistor of 120. Further, the base of transistor of 120 is coupled through resistor 126 to operating potential $V_{EE}$. The emitter of transistor 120 is coupled to operating potential $V_{EE}$. Also, amplifier 92 is capacitively coupled to oscillator circuit 14 whereby coupling capacitor 128 is coupled between the collector of transistor 40 and the base of transistor of 120.

In operation, bias circuit 90 includes a resistor ratio current mirror comprised of transistors 100 and 104 and resistors 102 and 108. By performing a loop analysis for bias circuit 90, one of ordinary skill in the art can readily obtain (neglecting base currents) the expression: $I_4 = I_5(R_{102}/R_{108})$ wherein currents $I_4$ and $I_5$ are respectively the currents through transistors 104 and 100.

Moreover, the voltage at the base of transistor 100 ($V_{B(100)}$) can be expressed as shown in EQN. 3.

$$V_{B(100)} = V_{CC} - I_4 \times R_{98} - V_{BE(94)} \qquad \text{EQN.3}$$

where $V_{BE(94)}$ is the base-emitter voltage of transistor 94.

It must now be realized that as voltage $V_F$ is varied from operating potential $V_{EE}$ to operating potential $V_{CC}$, the equivalent resistance between the emitter of transistor 104 and operating potential $V_{EE}$ varies. As a result, current $I_4$ will vary thereby varying the bias voltage at the base of transistor 100.

As an example, suppose that voltage $V_F$ is substantially decreased to operating potential $V_{EE}$. This effectively places resistor 110 in parallel with resistor 108 thereby making the equivalent resistance between the emitter of transistor 104 and operating potential $V_{EE}$ equal to $(R_{108}//R_{110})$ where // means "in parallel with". This has the effect of decreasing the equivalent resistance between the emitter of transistor 104 and operating potential $V_{EE}$. As a result, the voltage at the base of transistor 100 is decreased.

On the other hand, as voltage $V_F$ is substantially increased to operating potential $V_{CC}$, resistor 110 has less of an effect on the equivalent resistance between the emitter of transistor 104 and operating potential $V_{EE}$. This has the effect of increasing the equivalent resistance between the emitter of transistor 104 and operating potential $V_{EE}$. As a result, the voltage at the base of transistor 100 is increased.

By varying the voltage at the base of transistor 100, the voltage applied to the base of transistor 40 varies. As a result, the collector-base capacitance and the base-emitter capacitance of transistor 40 varies. This has the effect of varying the equivalent capacitance of the tank circuit. Consequently, the center frequency of oscillator circuit 14 is varied. In particular, if the voltage at the base of transistor 100 is increased, the center frequency of oscillator circuit 14 also increases. On the other hand, if the voltage at the base of transistor 100 is decreased, the center frequency of oscillator circuit 14 also decreases.

In summary, as voltage $V_F$ is varied, the center frequency of oscillation of oscillator circuit 14 is varied. Thus, the circuit shown in FIG. 2 is a voltage controlled oscillator circuit whose frequency can be adjusted via voltage $V_F$.

Output amplifier 92 is essentially an inverting amplifier having its inverting input at the base of transistor 120, its output at the collector of transistor 120, and its non-inverting input at the emitter of transistor 120 which is coupled to operating potential $V_{EE}$.

Resistor 124 is a negative feedback resistor coupled between the the output and inverting input of amplifier 92. Further, resistor 126 functions as a source resistor being coupled between the inverting input and ground. Therefore, the oscillatory signal appearing at the base of transistor 120 is amplified by the ratio of resistor 124 to resistor 126 ($R_{124}/R_{126}$) and subsequently supplied to terminal 20. In addition, resistor 122 can be chosen to set the bias current through output amplifier 92.

A great advantage of output amplifier 92 is that its output impedance (the impedance seen with feedback from terminal 20 to the collector of transistor 120) can be adjusted to be a predetermined impedance, for example 50 ohms.

By utilizing the small signal model for transistor 120, the output impedance of amplifier 92 with feedback ($R_{OUT(92)}$) can be simplified to the expression shown in EQN. 4.

$$R_{OUT(92)} = (R_{122}//R_{124})/[1 - B \times g_m(R_{122}//R_{124})(R_{126}//R_{124}//r_{pi})] \qquad \text{EQN. 4}$$

where $(R_{122}//R_{124})$ is the equivalent resistance seen looking in from the collector of transistor 120;

B is the loop gain which is substantially equal to $(-1/R_{124})$;

$g_m$ and $r_{pi}$ are respectively the transconductance and the small signal input resistance of transistor 120; and $(R_{126}//R_{124}//r_{pi})$ is the equivalent resistance seen looking in from the base of transistor 120.

The values for $g_m$ and $r_{pi}$ are dependent upon the collector current through transistor 120, as is well known. Further, the collector current through transistor 120 can be adjusted by choosing different values for resistor 122. Hence, the output impedance of amplifier 92 with feedback ($R_{OUT(92)}$) can easily be adjusted by choosing different values for resistor 122.

In summary, the output resistance seen from looking in from terminal 20 can be adjusted via resistor 122. Thus, output impedance of the VCO circuit of FIG. 2 can be designed to match the input impedance of a circuit (not shown) coupled to terminal 20 for maximum drive capability.

Figure 3:
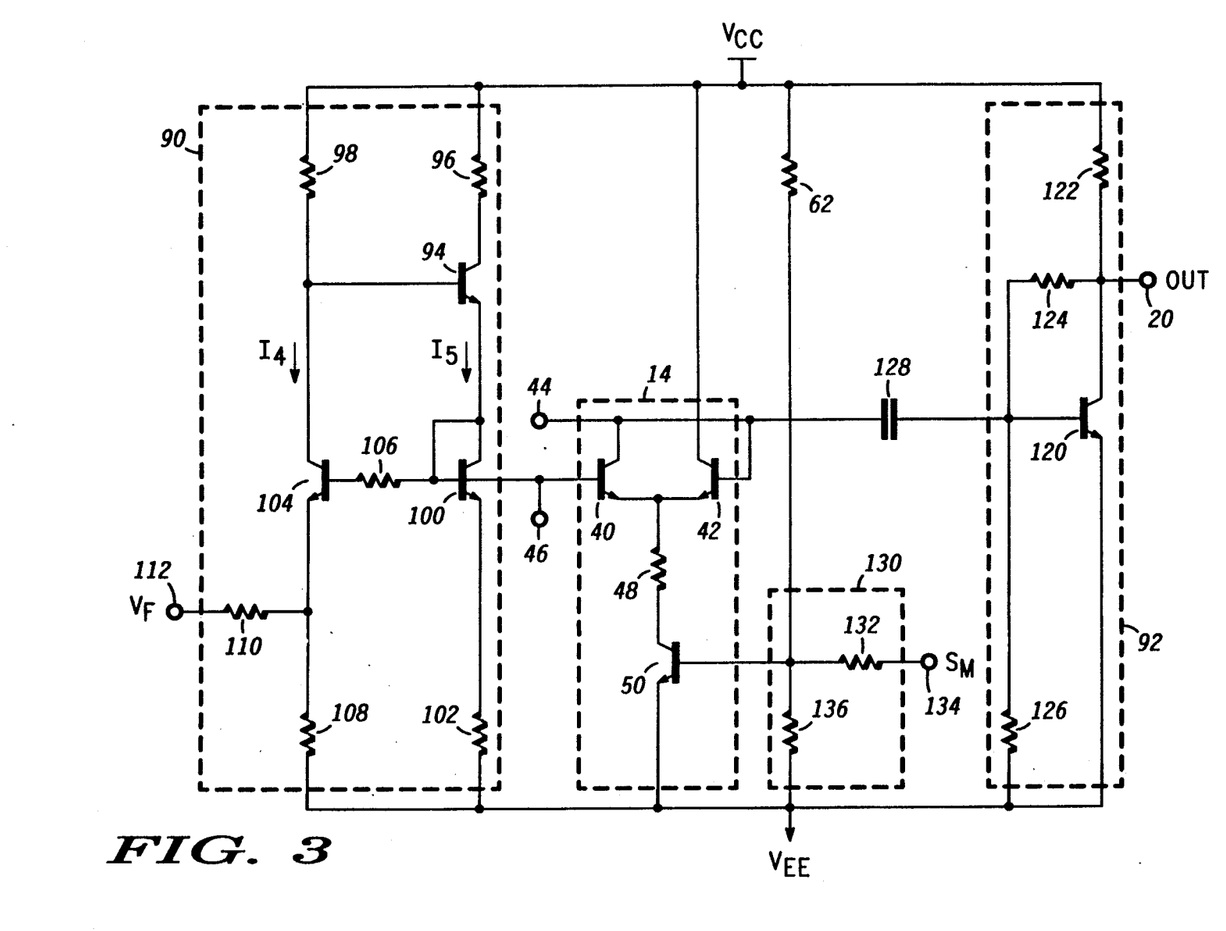
FIG. 3 is a detailed schematic diagram illustrating an alternate embodiment of a voltage controlled oscillator circuit in accordance with the present invention.

Referring to FIG. 3, a detailed schematic diagram illustrating an alternate embodiment of a voltage controlled oscillator circuit is shown. It is understood that components shown in FIG. 3 which are identical to the components shown in FIGS. 1 and 2 are identified by the same reference numbers. However, the voltage controlled oscillator circuit of FIG. 3 replaces AGC circuit 16 as shown in FIGS. 1 and 2 by modulation circuit 130.

Modulation circuit 130 includes resistor 132 coupled between the base of transistor 50 and terminal 134 whereby signal Sm is applied to terminal 134. Modulation circuit 130 also includes resistor 136 coupled between the base of transistor 50 and operating potential $V_{EE}$.

In operation, signal Sm which is typically an AC signal is applied to terminal 134. The signal appearing at the base of transistor 50 is an attenuated version of signal $S_M$ via the resistor divider network formed by resistors 132 and 136.

By modulating the base of transistor 50 via signal $S_M$, a frequency modulation effect is created such that as the frequency of signal Sm increases, the center frequency of oscillation of oscillator circuit 14 slightly increases. On the other hand, as the frequency of signal Sm decreases, the center frequency of oscillation of oscillator circuit 14 slightly decreases. As a result, by varying the frequency of signal $S_M$, the center frequency of oscillation can be adjusted to a high degree of resolution. For example, the center frequency of the output signal at terminal 20 may be 100 MHz, while signal $S_M$ allows the center frequency to be adjusted within Kilohertz of the center frequency.

It is worth noting that the circuits shown in FIGS. 2 and 3 may operate with a negative or positive supply voltage wherein operating potential $V_{CC}$ is a positive voltage and operating potential $V_{EE}$ is ground, or wherein operating potential $V_{CC}$ is ground and operating potential $V_{EE}$ is a negative voltage.

By now it should be apparent from the foregoing discussions, that a novel voltage controlled oscillator circuit has been provided that allows for varying the frequency of oscillation through an applied voltage signal ($V_F$) or a modulation signal ($S_M$). Further, the voltage controlled oscillator circuit includes an automatic gain control circuit and an output amplifier whose output resistance can be adjusted.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A voltage controlled oscillator circuit having first, second and third terminals, an external inductor being coupled across the first and second terminals, a control voltage being applied to the third terminal, comprising:
   an oscillator circuit being coupled to the first and second terminals for providing an output signal having a predetermined center frequency, said output signal of said oscillator circuit appearing at the first terminal;
   an output amplifier having an input and an output, said input of said output amplifier being coupled to receive said output signal of said oscillator circuit, said output of said output amplifier being coupled to an output terminal of the voltage controlled oscillator circuit, said output amplifer having an adjustable output impedance; and
   a bias circuit having an input responsive to the control voltage applied at the third terminal for providing an adjustable bias voltage to the second terminal such that when the control voltage is changed, said center frequency of said output signal of said oscillator circuit is changed.

2. The voltage controlled oscillator circuit according to claim 1 wherein said bias circuit includes:
   a first transistor having a collector, a base and an emitter, said collector of said first transistor being coupled to said base of said first transistor, said base of said first transistor being coupled to provide said adjustable bias voltage to the second terminal;
   a second transistor having a collector, a base and an emitter;
   a third transistor having a collector, a base and an emitter, said base of said third transistor being coupled to said collector of said second transistor, said emitter of said third transistor being coupled to said collector of said first transistor;
   a first resistor coupled between said emitter of said first transistor and a first supply voltage terminal;
   a second resistor being coupled between said emitter of said second transistor and said first supply voltage terminal;
   a third resistor being coupled between said collector of said third transistor and a second supply voltage terminal;
   a fourth resistor being coupled between said collector of said second transistor and said second supply voltage terminal; and
   a fifth resistor having first and second terminals, said first terminal of said fifth resistor being coupled to said emitter of said second transistor, said second terminal of said fifth resistor being coupled to the third terminal.

3. The voltage controlled oscillator circuit according to claim 2 wherein said output amplifier includes:
   a first transistor having a collector, a base and an emitter, said collector of said first transistor of said output amplifier being coupled to said output terminal of the voltage controlled oscillator circuit, said base of said first transistor of said output amplifier being coupled to receive said output signal of said oscillator circuit, said emitter of said first transistor of said output amplifier being coupled to said first supply voltage terminal;
   a first resistor being coupled between said base and collector of said first transistor of said output amplifier;
   a second resistor being coupled between said collector of said first transistor of said output amplifier and said second supply voltage terminal; and
   a third resistor being coupled between said base of said first transistor of said output amplifier and said first supply voltage terminal.

4. The voltage controlled oscillator circuit according to claim 3 wherein said oscillator includes:
   a first transistor having a collector, a base and an emitter, said collector of said first transistor of said oscillator circuit being coupled to the first terminal, said base of said first transistor of said oscillator circuit being coupled to the second terminal;
   a second transistor having a collector, a base and an emitter, said collector of said second transistor of said oscillator circuit being coupled to said second supply voltage terminal, said base of said second transistor of said oscillator circuit being coupled to said collector of said first transistor of said oscillator circuit, said emitter of said second transistor of said oscillator circuit being coupled to said emitter of said first transistor of said oscillator circuit;
   a third transistor having a collector, a base and an emitter, said base of said third transistor of said oscillator circuit being coupled to receive a first voltage signal, said emitter of said third transistor of said oscillator circuit being coupled to said first supply voltage terminal; and
   a first resistor being coupled between said emitter of said first transistor of said oscillator circuit and said collector of said third transistor of said oscillator circuit.

5. The voltage controlled oscillator circuit according to claim 4 further including a modulation circuit for providing said voltage signal to said base of said third transistor of said oscillator circuit, said voltage signal being an ac signal for modulating the frequency of said output signal of said oscillator circuit around said predetermined center frequency.

6. The voltage controlled oscillator circuit according to claim 4 further including an automatic gain control circuit including:
   a first transistor having a collector, a base and an emitter, said collector of said first transistor of said automatic gain control circuit being coupled to a fourth terminal at which an automatic gain control signal is applied, said base of said first transistor of said automatic gain control circuit being coupled to said collector of said first transistor of said automatic gain control circuit, said emitter of said first transistor of said automatic gain control circuit being coupled to provide said voltage signal to said base of said third transistor of said oscillator circuit, a second transistor having a collector, a base and an emitter, said collector of said second transistor of said automatic gain control circuit being coupled to said base of said first transistor of said automatic gain control circuit;

a third transistor having a collector, a base and an emitter, said base of said third transistor of said automatic gain control circuit being coupled to the collector of said first transistor of said oscillator circuit, said emitter of said third transistor of said automatic gain control circuit being coupled to said base of said second transistor of said automatic gain control circuit;

a first resistor being coupled between said emitter of said first transistor of said automatic gain control circuit and said first supply voltage terminal;

a second resistor being coupled between said emitter of said second transistor of said automatic gain control circuit and said first supply voltage terminal;

a third resistor being coupled between said base of said second transistor of said automatic gain control circuit and said first supply voltage terminal;

a fourth resistor being coupled between said collector of said first transistor of said automatic gain control circuit and said second supply voltage terminal; and a fifth resistor being coupled between said collector of said third transistor of said automatic gain control circuit and said second supply voltage terminal.

7. A voltage controlled oscillator circuit having first, second and third terminals, an external inductor being coupled across the first and second terminals, a control voltage being applied to the third terminal, comprising:

an oscillator circuit being coupled to the first and second terminals for providing an output signal having a predetermined center frequency, said output signal of said oscillator circuit appearing at the first terminal;

an output amplifier having an input and an output, said input of said output amplifier being coupled to receive said output signal of said oscillator circuit, said output of said output amplifier being coupled to an output terminal of the voltage controlled oscillator circuit, said output amplifier having an adjustable output impedance;

a bias circuit having an input responsive to the control voltage applied at the third terminal for providing an adjustable bias voltage to the second terminal such that when the control voltage is changed, said center frequency of said output signal of said oscillator circuit is changed; and said oscillator circuit being responsive to an ac voltage signal for modulating the frequency of said output signal of said oscillator circuit around said predetermined center frequency.

8. The voltage controlled oscillator circuit according to claim 7 wherein said bias circuit includes:

a first transistor having a collector, a base and an emitter, said collector of said first transistor being coupled to said base of said first transistor, said base of said first transistor being coupled to provide said adjustable bias voltage to the second terminal;

a second transistor having a collector, a base and an emitter;

a third transistor having a collector, a base and an emitter, said base of said third transistor being coupled to said collector of said second transistor, said emitter of said third transistor being coupled to said collector of said first transistor;

a first resistor coupled between said emitter of said first transistor and a first supply voltage terminal;

a second resistor being coupled between said emitter of said second transistor and said first supply voltage terminal;

a third resistor being coupled between said collector of said third transistor and a second supply voltage terminal;

a fourth resistor being coupled between said collector of said second transistor and said second supply voltage terminal; and a fifth resistor having first and second terminals, said first terminal of said fifth resistor being coupled to said emitter of said second transistor, said second terminal of said fifth resistor being coupled to the third terminal.

9. The voltage controlled oscillator circuit according to claim 8 wherein said output amplifier includes:

a first transistor having a collector, a base and an emitter, said collector of said first transistor of said output amplifier being coupled to said output terminal of the voltage controlled oscillator circuit, said base of said first transistor of said output amplifier being coupled to receive said output signal of said oscillator circuit, said emitter of said first transistor of said output amplifier being coupled to said first supply voltage terminal;

a first resistor being coupled between said base and collector of said first transistor of said output amplifier;

a second resistor being coupled between said collector of said first transistor of said output amplifier and said second supply voltage terminal; and a third resistor being coupled between said base of said first transistor of said output amplifier and said first supply voltage terminal.

10. The voltage controlled oscillator circuit according to claim 9 wherein said oscillator includes:

a first transistor having a collector, a base and an emitter, said collector of said first transistor of said oscillator circuit being coupled to the first terminal, said base of said first transistor of said oscillator circuit being coupled to the second terminal;

a second transistor having a collector, a base and an emitter, said collector of said second transistor of said oscillator circuit being coupled to said second supply voltage terminal, said base of said second transistor of said oscillator circuit being coupled to said collector of said first transistor of said oscillator circuit, said emitter of said second transistor of said oscillator circuit being coupled to said emitter of said first transistor of said oscillator circuit;

a third transistor having a collector, a base and an emitter, said base of said third transistor of said oscillator circuit being coupled to receive said ac voltage signal, said emitter of said third transistor of said oscillator circuit being coupled to said first supply voltage terminal; and a first resistor being coupled between said emitter of said first transistor of said oscillator circuit and said collector of said third transistor of said oscillator circuit.

11. A voltage controlled oscillator circuit having first, second and third terminals, an external inductor being coupled across the first and second terminals, a control voltage being applied to the third terminal, comprising:
- an oscillator circuit being coupled to the first and second terminals for providing an output signal having a predetermined center frequency, said output signal of said oscillator circuit appearing at the first terminal;
- an output amplifier having an input and an output, said input of said output amplifier being coupled to receive said output signal of said oscillator circuit, said output of said output amplifier being coupled to an output terminal of the voltage controlled oscillator circuit, said output amplifier having an adjustable output impedance;
- a bias circuit having an input responsive to the control voltage applied at the third terminal for providing an adjustable bias voltage to the second terminal such that when the control voltage is changed, said center frequency of said output signal of said oscillator circuit is changed; and
- an automatic gain control circuit being responsive to a voltage signal applied at a fourth terminal for adjusting the gain of said oscillator circuit.

12. The voltage controlled oscillator circuit according to claim 11 wherein said bias circuit includes:
- a first transistor having a collector, a base and an emitter, said collector of said first transistor being coupled to said base of said first transistor, said base of said first transistor being coupled to provide said adjustable bias voltage to the second terminal;
- a second transistor having a collector, a base and an emitter;
- a third transistor having a collector, a base and an emitter, said base of said third transistor being coupled to said collector of said second transistor, said emitter of said third transistor being coupled to said collector of said first transistor;
- a first resistor coupled between said emitter of said first transistor and a first supply voltage terminal;
- a second resistor being coupled between said emitter of said second transistor and said first supply voltage terminal;
- a third resistor being coupled between said collector of said third transistor and a second supply voltage terminal;
- a fourth resistor being coupled between said collector of said second transistor and said second supply voltage terminal; and
- a fifth resistor having first and second terminals, said first terminal of said fifth resistor being coupled to said emitter of said second transistor, said second terminal of said fifth resistor being coupled to the third terminal.

13. The voltage controlled oscillator circuit according to claim 12 wherein said output amplifier includes:
- a first transistor having a collector, a base and an emitter, said collector of said first transistor of said output amplifier being coupled to said output terminal of the voltage controlled oscillator circuit, said base of said first transistor of said output amplifier being coupled to receive said output signal of said oscillator circuit, said emitter of said first transistor of said output amplifier being coupled to said first supply voltage terminal;
- a first resistor being coupled between said base and collector of said first transistor of said output amplifier;
- a second resistor being coupled between said collector of said first transistor of said output amplifier and said second supply voltage terminal; and
- a third resistor being coupled between said base of said first transistor of said output amplifier and said first supply voltage terminal.

14. The voltage controlled oscillator circuit according to claim 13 wherein said oscillator includes:
- a first transistor having a collector, a base and an emitter, said collector of said first transistor of said oscillator circuit being coupled to the first terminal, said base of said first transistor of said oscillator circuit being coupled to the second terminal;
- a second transistor having a collector, a base and an emitter, said collector of said second transistor of said oscillator circuit being coupled to said second supply voltage terminal, said base of said second transistor of said oscillator circuit being coupled to said collector of said first transistor of said oscillator circuit, said emitter of said second transistor of said oscillator circuit being coupled to said emitter of said first transistor of said oscillator circuit;
- a third transistor having a collector, a base and an emitter, said base of said third transistor of said oscillator circuit being coupled to receive said voltage signal of said automatic gain control circuit, said emitter of said third transistor of said oscillator circuit being coupled to said first supply voltage terminal; and
- a first resistor being coupled between said emitter of said first transistor of said oscillator circuit and said collector of said third transistor of said oscillator circuit.

15. The voltage controlled oscillator circuit according to claim 14 wherein said automatic gain control circuit includes:
- a first transistor having a collector, a base and an emitter, said collector of said first transistor of said automatic gain control circuit being coupled to said fourth terminal, said base of said first transistor of said automatic gain control circuit being coupled to said collector of said first transistor of said automatic gain control circuit, said emitter of said first transistor of said automatic gain control circuit being coupled to provide said voltage signal to said base of said third transistor of said oscillator circuit,
- a second transistor having a collector, a base and an emitter, said collector of said second transistor of said automatic gain control circuit being coupled to said base of said first transistor of said automatic gain control circuit;
- a third transistor having a collector, a base and an emitter, said base of said third transistor of said automatic gain control circuit being coupled to the collector of said first transistor of said oscillator circuit, said emitter of said third transistor of said automatic gain control circuit being coupled to said base of said second transistor of said automatic gain control circuit;
- a first resistor being coupled between said emitter of said first transistor of said automatic gain control circuit and said first supply voltage terminal;

a second resistor being coupled between said emitter of said second transistor of said automatic gain control circuit and said first supply voltage terminal;

a third resistor being coupled between said base of said second transistor of said automatic gain control circuit and said first supply voltage terminal;

a fourth resistor being coupled between said collector of said first transistor of said automatic gain control circuit and said second supply voltage terminal; and a fifth resistor being coupled between said collector of said third transistor of said automatic gain control circuit and said second supply voltage terminal.

* * * * *